United States Patent [19]
Takahashi et al.

[11] Patent Number: 6,093,212
[45] Date of Patent: Jul. 25, 2000

[54] METHOD FOR SELECTING OPERATION CYCLES OF A SEMICONDUCTOR IC FOR PERFORMING AN IDDQ TEST BY USING A SIMULATION

[75] Inventors: Toshihiro Takahashi, Osaka; Yasutaka Tsukamoto, Hyogo, both of Japan

[73] Assignee: Ricoh Company, Ltd., Tokyo, Japan

[21] Appl. No.: 09/139,716

[22] Filed: Aug. 25, 1998

[30] Foreign Application Priority Data

Aug. 26, 1997 [JP] Japan ..................................... 9-229273

[51] Int. Cl.$^7$ ....................................................... G06F 17/50
[52] U.S. Cl. ................................ 703/14; 703/19; 714/25; 714/726; 714/741
[58] Field of Search ................................ 703/14, 13, 15, 703/16, 17, 19, 28; 714/30, 37, 46, 47, 726, 731, 741, 25

[56] References Cited

U.S. PATENT DOCUMENTS

| | | | |
|---|---|---|---|
| 5,459,737 | 10/1995 | Andrews ....................................... | 72/42 |
| 5,552,744 | 9/1996 | Burlinson et al. ........................ | 327/401 |
| 5,570,034 | 10/1996 | Needham et al. ........................ | 324/763 |
| 5,644,251 | 7/1997 | Colwell et al. ............................. | 326/16 |
| 5,694,063 | 12/1997 | Burlison et al. ........................... | 327/50 |
| 5,721,495 | 2/1998 | Jennion et al. ............................ | 324/765 |
| 5,914,615 | 6/1999 | Chess ........................................ | 324/765 |

FOREIGN PATENT DOCUMENTS 4-44172 of 1992 Japan .

OTHER PUBLICATIONS

Mallarapu, S.R. et al., "IDDQ Testing on a Custom Automotive IC," IEEE Journal of Solid–State Circuits, vol. 3, No. 3, Mar. 1995, pp. 295–299.

Caravella, J.S. et al., "Circuit Techniques for Standby Mode/Iddq Test Compatible Voltage Comparators," Proc. of 8th Annual IEEE Int'l ASIC Conf. and Exhibit, Sep. 1995, pp. 216–217.

Sanada, M., "A CAD–Based Approach to Failure Diagnosis of CMOS LSI's Using Abnormal Iddq," Proc. of 14th VLSI Test Symp., Apr.–May 1996, pp. 186–191.

Ribas–Xirgo L. et al., "Automatic Test Pattern Generation of Iddq Faults Based Upon Symbolic Simulation," IEEE Int'l Workshop on IDDQ Testing, Oct. 1996, pp. 94–98.

Panic, V. et al., "Iddq Fault Model Generation for BiCMOS and CMOS Circuits," Proc. of 21st Int'l Conference on Microelectronics, vol. 2, Sep. 1997, pp. 771–774.

Kazuo Wakui, et al., "A pattern selection algorithm for $I_{DDQ}$ test", 1995 Electronic Information Communication Electronics Society Conference, vol. 2, p. 185, C–463, Sep. 1995.

Weiwei Mao, et al., "QUIETEST: A Quiescent Current Testing Methodology for Detecting Leakage Faults", 1990 ICCAD Conference held by IEEE, pp. 280–283.

Primary Examiner—Kevin J. Teska
Assistant Examiner—Kyle J. Choi
Attorney, Agent, or Firm—Dickstein Shapiro Morin & Oshinsky LLP

[57] ABSTRACT

Operation cycles to be subjected to an IDDQ test are selected from among operation cycles defined by a test pattern for a functional test of a CMOS integrated circuit so that a sufficient and necessary number of operation cycles are accurately and rapidly selected. A combination of sets of m-bit data are selected so that the combination includes sets of m-bit data each bit of which is changed from one of the values "0" and "1" to the other at least once. The operation cycles corresponding to the sets of m-bit data included in the combination are rendered to be the IDDQ test cycles to be subjected to the IDDQ test.

23 Claims, 10 Drawing Sheets

TOGGLE RECOGNITION
REGISTER(2×m BITS)

TOGGLED FLAG
STORING SECTION
250 (m BITS)

UNTOGGLED DATA
STORING SECTION
251 (m BITS)

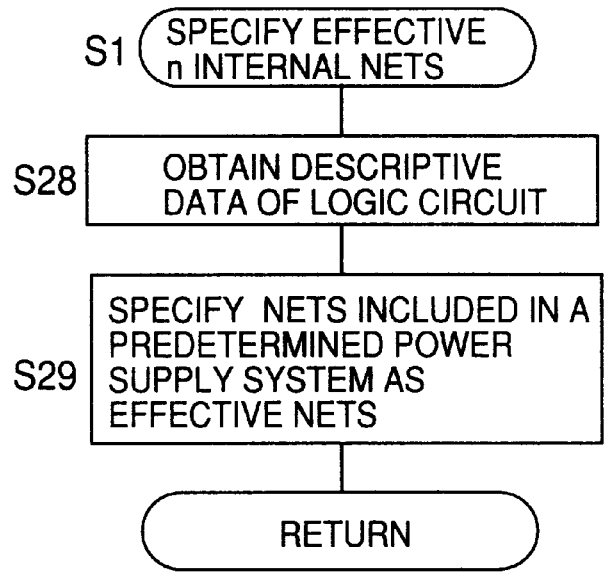
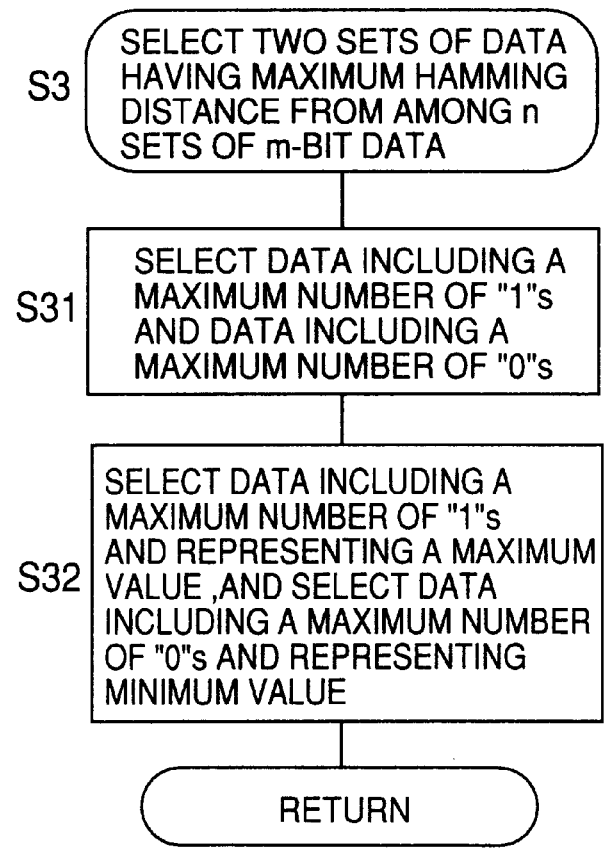

METHOD FOR SELECTING OPERATION CYCLES OF A SEMICONDUCTOR IC FOR PERFORMING AN IDDQ TEST BY USING A SIMULATION

BACKGROUND OF THE INVENTION

1. Field of the Invention

The present invention generally relates to a method for testing a semiconductor integrated circuit and, more particularly, to a method for selecting operation cycles of a semiconductor integrated circuit so as to perform an IDDQ measurement in the selected operation cycles.

2. Description of the Related Art

As CMOS integrated circuits are increasingly highly integrated and are formed into fine structures, a frequency of occurrence of new fault modes which are difficult to find by a conventional functional test has been increasing. The new fault modes include an open fault and a short fault due to a fine structure of wiring between elements in a semiconductor integrated circuit. Thus, if only the functional test is performed for an inspection, a semiconductor integrated circuit which has one of the above-mentioned new faults may be delivered as a product which has passed the inspection and, thereby, the semiconductor integrated circuit having a fault may be assembled into a final product.

An IDDQ test is suggested to detect the above-mentioned new faults. In the IDDQ test, a measurement of quiescent power supply current (IDDQ) is performed so as to detect existence of a fault. Specifically, in the IDDQ test, a fine power-supply current flowing in a CMOS integrated circuit which is in a steady state (standby state) is measured so as to determine existence of a fault by a level of the power-supply current. In a normal CMOS integrated circuit, only a very small power-supply current flows. That is, if a large current flows in a CMOS integrated circuit in a standby state, this indicates that the CMOS integrated circuit includes a defect or fault therein. Although a state of an integrated circuit continuously changes during a normal operation, the IDDQ test can be performed during an operation cycle which is in a standby state.

A technique to detect the standby cycle by using logical simulation is known. For example, Japanese Laid-Open Patent Application No. 4-44172 suggests determining an operation cycle to be one which is in the standby state when the following four conditions are satisfied.

1) Output signals of a plurality of gates are not in conflict with each other (not a bus conflict state).
2) All of the gates connected to a bus are not in a high-impedance "Z" state.
3) A logical value at a node with a pull-up is in a high level "H".
4) A logical value at a node with a pull-down is in a low level "L".

If only a quality of test is considered, that is, if only a capability of detection of a fault is of concern, it is better to perform a test during various states of an operation. Accordingly, it is most appropriate to perform the test for all cycles in which the standby state is achieved. However, in practice, a number of the standby cycles used for the test should be as small as possible since a time for performing the test directly influences a manufacturing cost. That is, it is desired to reduce a time spent on the test as much as possible while maintaining a quality of a result of the above an allowable level.

The IDDQ test includes measurement of a current as mentioned above. Generally, measurement of a current takes a longer time than that of measurement of a voltage. In order to reduce a time spent on the test, the number of measurements should be reduced. Accordingly, is it desired to select the number of standby cycles which is sufficient for maintaining a certain level of the quality of the test result. The following two papers suggest methods for selecting the standby cycles.

1) Kazuo Wakui, Toshinobu Ono and Masaaki Yoshida, "A pattern selection algorithm for IDDQ test", proceedings of 1995 Electronic Information Communication Electronics Society Conference, vol.2, p.185, C-463, September 1995.

First, an operator designates a number "n" of cycles on which the IDDQ test is performed. Then, a logical simulation is performed by inputting test patterns for a functional test so as to select and extract first n standby cycles. Then, a fault coverage is calculated for the n IDDQ tests. Thereafter, subsequent standby cycles are investigated one by one so as to check if the fault coverage is improved when each of the subsequent standby cycles is replaced with one of the first n standby cycles. If there is a standby cycle which improves the fault coverage, the standby cycle is replaced with the one of the first n standby cycles. This operation is performed with respect to all of the subsequent standby cycles.

2) Weiwei Mao, Ravi K. Gulati, Deepak K. Goel and Michael D. Ciletti, "QUIETEST: A Quiescent Current Testing Methodology for Detecting Leakage Faults", proceedings of the 1990 ICCAD conference held by IEEE, pp. 280–283.

In the method disclosed in this document, a logical simulation is performed while referring to a fault table which is previously prepared by an operator. The fault table indicates which state of input corresponds to which type of fault with respect to each of the gates in a circuit. If the operator does not designate a number "n" of test cycles on which the IDDQ test is performed during execution of the logical simulation, a cycle from which at least one new fault can be detected is added to the test cycles. On the other hand, if the operator designates the number "n" of the test cycles, a cycle from which a number of new faults to be detected is greater than an expected number of faults per one cycle is added to the test cycles.

In the method suggested by Wakui et al., there is a problem in that an operator must designate the number "n" of the test cycles. That is, the number of cycles sufficient for obtaining a desired accuracy of detection cannot be decided previously. Accordingly, the operator is forced to designate an uncertain number of cycles. Thus, the number of cycles designated by the operator may be insufficient for obtaining a desired result, or may be in excess. Whichever happens, an appropriate number of cycles cannot be obtained in most cases.

Additionally, in the method suggested by Wakui et al., there is another problem in that a possibility for replacement of one of the first n standby cycles must be checked with all of the standby cycles subsequent to the first n standby cycles, and this operation takes a long time. In an extreme case, the first n standby cycles may remain at the end of the operation for checking a possibility of replacement. However, even in such a case, all standby cycles must be checked in this method. Thus, a time is wasted for the checking operation. Especially, if the number of test patterns for a functional test is extremely large, such a wasted time may be a serious problem.

In the method suggested by Mao et al., there is a problem in that the fault table must be prepared previously although the fault table once prepared can be commonly used for other circuits. This method also has the same problem with the method suggested by Wakui et al. when the number "n" of cycles for performing the IDDQ test is designated by an operator. Additionally, there may be a problem in that a result desired by the operator cannot be obtained when the operator does not designate the number "n" of cycles for performing the IDDQ test.

Consideration will now be given of a case in which all faults can be detected by the last two cycles of a series of operation cycles in the test patterns for a functional test. In this case, since the operation cycles are sequentially checked with respect to passage of time, it is possible that cycles preceding the last two cycles are selected. As a result, there is a problem in that an excessive number of cycles are selected.

SUMMARY OF THE INVENTION

It is a general object of the present invention to provide an improved and useful method for selecting operation cycles of a semiconductor integrated circuit for performing an IDDQ test in which the above-mentioned problems are eliminated.

A more specific object of the present invention is to provide a method for selecting operation cycles to be subjected to an IDDQ test from among operation cycles defined by a test pattern for a functional test of a CMOS integrated circuit so that a sufficient and necessary number of operation cycles are accurately and rapidly selected.

In order to achieve the above-mentioned objects, there is provided according to a first aspect of the present invention a method for selecting IDDQ test cycles by performing a logical simulation of an operation of an integrated circuit including a plurality of internal nets or nodes, the method comprising the steps of:

a) detecting operation cycles which are in a standby state from among operation cycles in the logical simulation;

b) storing n sets of m-bit data corresponding to the operation cycles detected in step a), each set of m-bit data comprising m bits representing a state of the respective m internal nets or nodes included in said integrated circuit;

c) preparing a toggled flag for each of the m bits of the set of m-bit data, the toggled flag indicating whether the corresponding bit of the set of m-bit data has been set to both values "0" and "1" at least once;

d) selecting two sets of m-bit data from among the n sets of m-bit data so that the two sets of m-bit data have a maximum Hamming distance therebetween;

e) setting the toggled flag by comparing the first set of m-bit data with the second set of m-bit data so that the toggled flag is raised for each bit of which a value is changed from one of the values "0" and "1" to the other between the two sets of m-bit data;

f) detecting each bit of the set of m-bit data for which the toggled flag is not raised so as to recognize bit positions at which each bit has not been changed from one of the values "0" and "1" to the other;

g) selecting one of the n sets of m-bit data other than the previously selected sets of m-bit data, the one of the n sets of m-bit data including a set of bits at the recognized bit positions having a maximum Hamming distance from the set of bits at the bit positions recognized in step f);

h) updating the toggled flag by comparing the set of bits of the one of n sets of m-bit data selected in step g) with the set of bits at the bit positions recognized in step f) so that the toggled flag is raised for each bit of which a value is changed from one of the values "0" and "1" to the other;

i) repeating steps f), g) and h) until a predetermined condition is satisfied; and j) rendering the operation cycles corresponding to the previously selected sets of m-bit data to be the IDDQ test cycles.

According to the above-mentioned first aspect of the present invention, the selection of the IDDQ test cycles is performed after the logical simulation of the operation of the integrated circuit is completed. In the procedure of the present method, a combination of sets of m-bit data is selected so that the combination includes a minimum number of sets of m-bit data in which each bit is changed from one of the values "0" and "1" to the other at least once. By rendering the operation cycles corresponding to the sets of m-bit data included in the combination as the IDDQ test cycles to be subjected to the IDDQ test, the IDDQ test can be performed with a minimum number of IDDQ test cycles with a sufficient accuracy of the result of the IDDQ test. Additionally, in the method according to the first aspect of the present invention, there is no need to previously designate the number of IDDQ test cycles to be selected.

It should be noted that the above-mentioned method according to the first aspect of the present invention may be achieved by computer programs stored in a computer readable medium.

In the above-mentioned method, step d) may comprise the steps of:

d-1) selecting one of the n sets of m-bit data which includes a maximum number of bits having the value "1" and another one of the n sets of m-bit data which includes a maximum number of bits having the value "0"; and d-2) proceeding to step j) when all bits included in the one of the n sets of m-bit data have the value "1" and all bits included in the other one of the n sets of m-bit data have the value "0".

d-3) selecting one of n sets of m-bit data representing a maximum value from among a plurality of sets of m-bit data each of which is selected as having the maximum number of bits having the value "1" in step d-1), and selecting one of n sets of m-bit data representing a minimum value from among a plurality of sets of m-bit data each of which is selected as having the maximum number of bits having the value "0" in step d-1).

Additionally, step i) may comprise the step of repeating steps f), g) and h) until a number of raised toggled flags exceeds a predetermined value.

Alternatively, step i) may comprise the step of repeating steps f), g) and h) until a predetermined number of sets of m-bit data are selected in steps d) and g).

The method may further comprise the steps of:

detecting inverters included in said integrated circuit; and including only one of an input net and an output net of each of the inverters in the m internal nets.

Additionally, the method may further comprise the steps of:

detecting buffers included in said integrated circuit; and including only one of an input net and an output net of each of the buffers in the m internal nets.

Further, the method may further comprise the steps of:

designating internal nets to be included in the m internal nets; and storing m-bit data comprising m bits each of which represents a state of a respective one of the m internal nets.

Additionally, the method may further comprise the steps of:

designating a functional block included in said integrated circuit; and storing m-bit data comprising m bits each of which represents a state of a respective one of the m internal nets included in said functional block.

Additionally, the method may further comprise the steps of:

designating a hierarchical level of said integrated circuit; and storing m-bit data comprising m bits each of which represents a state of a respective one of the m internal nets included in said hierarchical level of said integrated circuit.

The method may further comprise the steps of:

designating a power-supply system in said integrated circuit; and storing m-bit data comprising m bits each of which represents a state of a respective one of the m internal nets included in said power-supply system in said integrated circuit.

Additionally, in the method according to the first aspect of the present invention, step a) may comprise the step of:

designating operational cycles to be subjected to the IDDQ test; and detecting operation cycles which are in a standby state from among the designated operation cycles.

Additionally, there is provided according to a second aspect of the present invention a method for selecting IDDQ test cycles by performing a logical simulation of an operation of an integrated circuit including a plurality of internal nets, the method comprising the steps of:

a) performing a logical simulation of an operation of said integrated circuit;

b) determining whether an operation cycle in the logical simulation is in a standby state, a determination being performed on an individual operation cycle basis;

c) selecting a first IDDQ test cycle which is determined to be in the standby state first;

d) storing a set of m-bit data corresponding to said first IDDQ test cycle as a reference set of m-bit data, the set of m-bit data comprising a number of bits corresponding to the number of internal nets included in said integrated circuit;

e) setting a reference value with respect to a Hamming distance in accordance with a set of m-bit data which comprises a number of bits corresponding to the number of internal nets included in said integrated circuit;

f) continuing the logical simulation and selecting a second IDDQ test cycle which is determined to be in the standby state, a set of m-bit data corresponding to said second IDDQ test cycle having a Hamming distance greater than said reference value with respect to the set of m-bit data corresponding to said first IDDQ test cycle;

g) preparing a toggled flag for each of the m bits of the reference set of m-bit data, the toggled flag indicating whether the corresponding bit of the reference set of m-bit data has been set to both values "0" and "1" at least once;

h) storing the set of m-bit data corresponding to said second IDDQ test cycle as the reference set of m-bit data;

i) setting the toggled flag by comparing the set of m-bit data corresponding to said first IDDQ test cycle with the set of m-bit data corresponding to said second IDDQ test cycle so that the toggled flag is raised for each bit of which a value has been changed from one of the values "0" and "1" to the other between the two sets of m-bit data;

j) detecting each bit of the reference set of m-bit data for which the toggled flag is not raised so as to recognize bit positions at which each bit has not been changed from one of the values "0" and "1" to the other;

k) selecting a next IDDQ test cycle which is determined to be in the standby state, a set of m-bit data corresponding to the next IDDQ test cycle at the recognized bit positions having a Hamming distance greater than said reference value with respect to the reference set of m-bit data at the recognized bit positions;

l) updating the toggled flag by comparing the set of m-bit data corresponding to the next IDDQ test cycle with the reference set of m-bit data so that the toggled flag is raised for each bit of which a value has been changed from one of the values "0" and "1" to the other;

m) storing the set of m-bit data corresponding to the next IDDQ test cycle as the reference set of m-bit data; and n) repeating steps j), k), l) and m) until a predetermined condition is satisfied.

According to the above-mentioned method, the selection of the IDDQ test cycle is performed concurrently with execution of the logical simulation. Thus, the selection of the IDDQ test cycles can be completed sub substantially at the same time as when the logical simulation is completed. Thus, a result of the selection can be obtained in a short time.

It should be noted that the above-mentioned method according to the second aspect of the present invention may be achieved by computer programs stored in a computer readable medium.

In the method according to the second aspect of the present invention, step n) may comprise the step of repeating steps j), k), l) and m) until a number of raised toggled flags exceeds a predetermined value.

Alternatively, step n) may comprise the step of repeating steps j), k), l) and m) until a predetermined number of IDDQ test cycles are selected.

Additionally, the method according to the second aspect of the present invention may further comprise the steps of:

detecting inverters included in said integrated circuit; and including only one of an input net and an output net of each of the inverters in the m internal nets.

Further, the method may further comprise the steps of:

detecting buffers included in said integrated circuit; and including only one of an input net and an output net of each of the buffers in the m internal nets.

Further, the method may further comprise the step of:

designating internal nets to be included in the m internal nets.

The method may further comprise the steps of:

designating a functional block included in said integrated circuit; and storing m-bit data comprising m bits each of which represents a state of a respective one of the m internal nets included in said functional block.

Additionally, the method may further comprise the steps of:

designating a hierarchical level of said integrated circuit; and storing m-bit data comprising m bits each of which represents a state of a respective one of the m internal nets included in said hierarchical level of said integrated circuit.

Additionally, the method may further comprise the steps of:

designating a power-supply system in said integrated circuit; and storing m-bit data comprising m bits each of which represents a state of a respective one of the m internal nets included in said power-supply system in said integrated circuit.

Additionally, in the method according to the second aspect of the present invention, step a) may comprise the step of:

designating operational cycles to be subjected to the IDDQ test; and performing the logical simulation for the designated operation cycles.

Other objects, features and advantages of the present invention will become more apparent from the following detailed description when read in conjunction with the accompanying drawings.

BRIEF DESCRIPTION OF THE DRAWINGS

FIG. 10 is a flowchart of a fourth variation of the process for specifying the m internal nets to be subjected to the IDDQ test;

FIG. 11 is a flowchart of a process for selecting two sets of m-bit data from among n sets of m-bit data stored in the storage device 202, the two sets of m-bit data being regarded as having an approximately maximum Hamming distance therebetween;

DETAILED DESCRIPTION OF THE PREFERRED EMBODIMENTS

Figure 1:
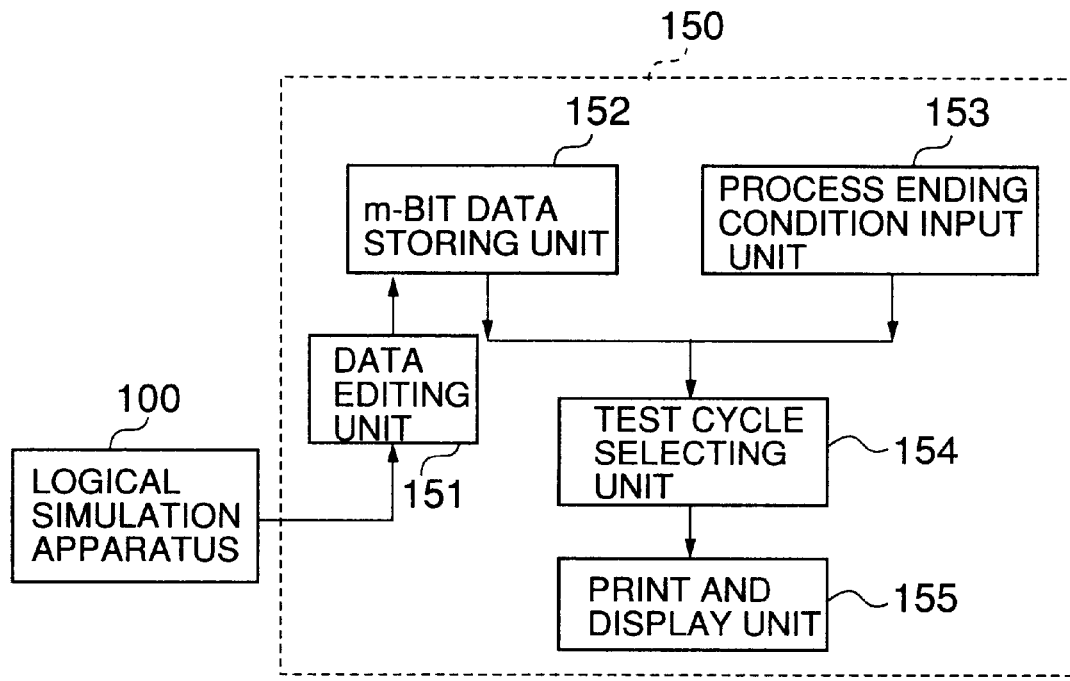
FIG. 1 is a block diagram of an IDDQ test cycle selecting system which performs a method according to a first embodiment of the present invention.

A description will now be given of a first embodiment of the present invention. FIG. 1 is a block diagram of an IDDQ test cycle selecting system 150 which performs a method according to the first embodiment of the present invention.

In FIG. 1, a logical simulation apparatus 100 performs a simulation of an operation of a CMOS integrated circuit described with HDL (Hardware Design Language). The logical simulation apparatus 100 supplies information with respect to standby cycles and information with respect to internal nets or nodes of the CMOS integrated circuit to the IDDQ test cycle selecting system 150 in accordance with results of the simulation.

In the IDDQ test cycle selecting system 150, a data editing unit 151 receives the information from the logical simulation apparatus 100. The data editing unit 151 specifies m internal nets from among M internal nets of the entire circuit so that the m internal nets are subjected to a process for selecting the IDDQ test cycles. The data editing unit 151 outputs m-bit data which represents a signal state of each of the specified m internal nets. It should be noted, as described later, that all of the M internal nets may be used as the internal nets to be subjected to the process for selecting the IDDQ test cycles. Additionally, with respect to an element such as an inverter or a buffer in which an input and an output are provided on a one-to-one basis, one of the input net and the output net may be used as an internal net to be subjected to the process for selecting the IDDQ test cycles. Further, the internal nets used in the process for selecting the IDDQ test can be designated by a setting operation of an operator, or may be designated on a unit basis such as a functional block, a hierarchical structure or a power-supply system. The M internal nets present in the logic circuit can be specified based on the described data of the logic circuit stored in the logical simulation apparatus 100. It should be noted that the data editing unit 151 can be provided in the logical simulation apparatus 100.

In the IDDQ test cycle selecting system 150, an m-bit data storing unit 152 stores m-bit data output from the data editing unit 151. A process ending condition input unit 153 is a man-machine interface for externally setting a condition for selecting the IDDQ test cycles used in the IDDQ test performed by a test cycle selecting unit 154. The process ending condition input unit 153 also sets a condition for ending the process for selecting IDDQ test cycles.

The test cycle selecting unit 154 selects a combination of a minimum number of standby cycles from among n standby cycles. In the combination of standby cycles, each of the bits of the m-bit data, each of which indicates a state of the respective m internal nets, takes both values "1" and "0" at least once. That is, each bit of the m-bit data changes from "0" to "1" or from "1" to "0" between the operation cycles of the selected combination.

A print and display unit 155 prints or displays information indicating a position of each of the standby cycles selected by the test cycle selecting unit 154, the position being counted from a first operation cycle in the logical simulation.

Figure 2:
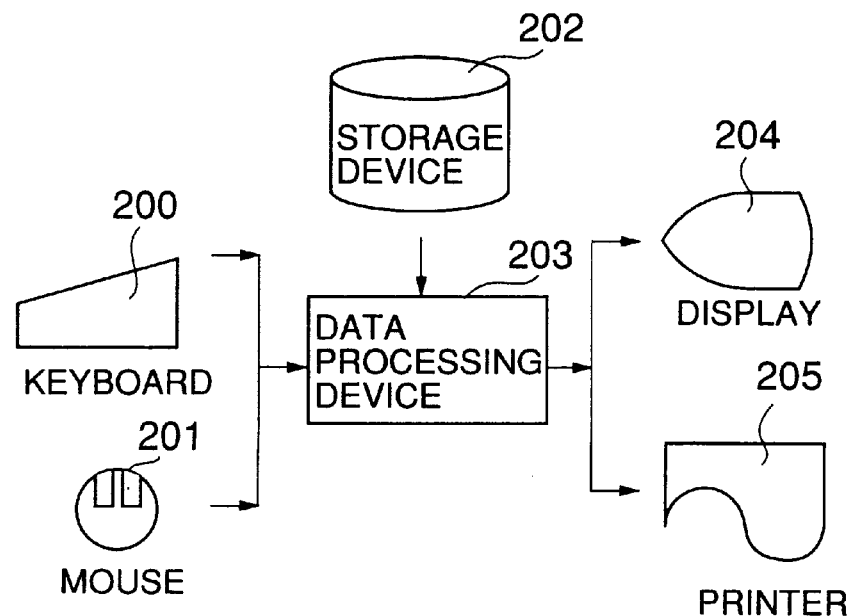
FIG. 2 is an illustration showing a hardware structure of the IDDQ test cycle selecting system shown in FIG. 1.

FIG. 2 is an illustration showing a hardware structure of the IDDQ test cycle selecting system 150. As shown in FIG.

2, the IDDQ test cycle selecting system 150 comprises a keyboard 200, a mouse 201, a storage device 202, a data processing device 203, a display 204 and a printer 205.

The keyboard 200 and the mouse 201 together serve as the process ending condition input unit 153 shown in FIG. 1. The storage device 202 serves as the m-bit data storing unit 152 shown in FIG. 1. The data processing device 203 comprises a central processing unit (CPU) and a memory for storing programs of a process for selecting the IDDQ test cycles. The CPU of the data processing device 203 executes the programs of the process for selecting the IDDQ test cycles stored in the memory so as to serve as the data editing unit 151 and the test cycle selecting unit 154. The display 204 and the printer 205 serve as the print and display unit 155 shown in FIG. 1.

Figure 3:
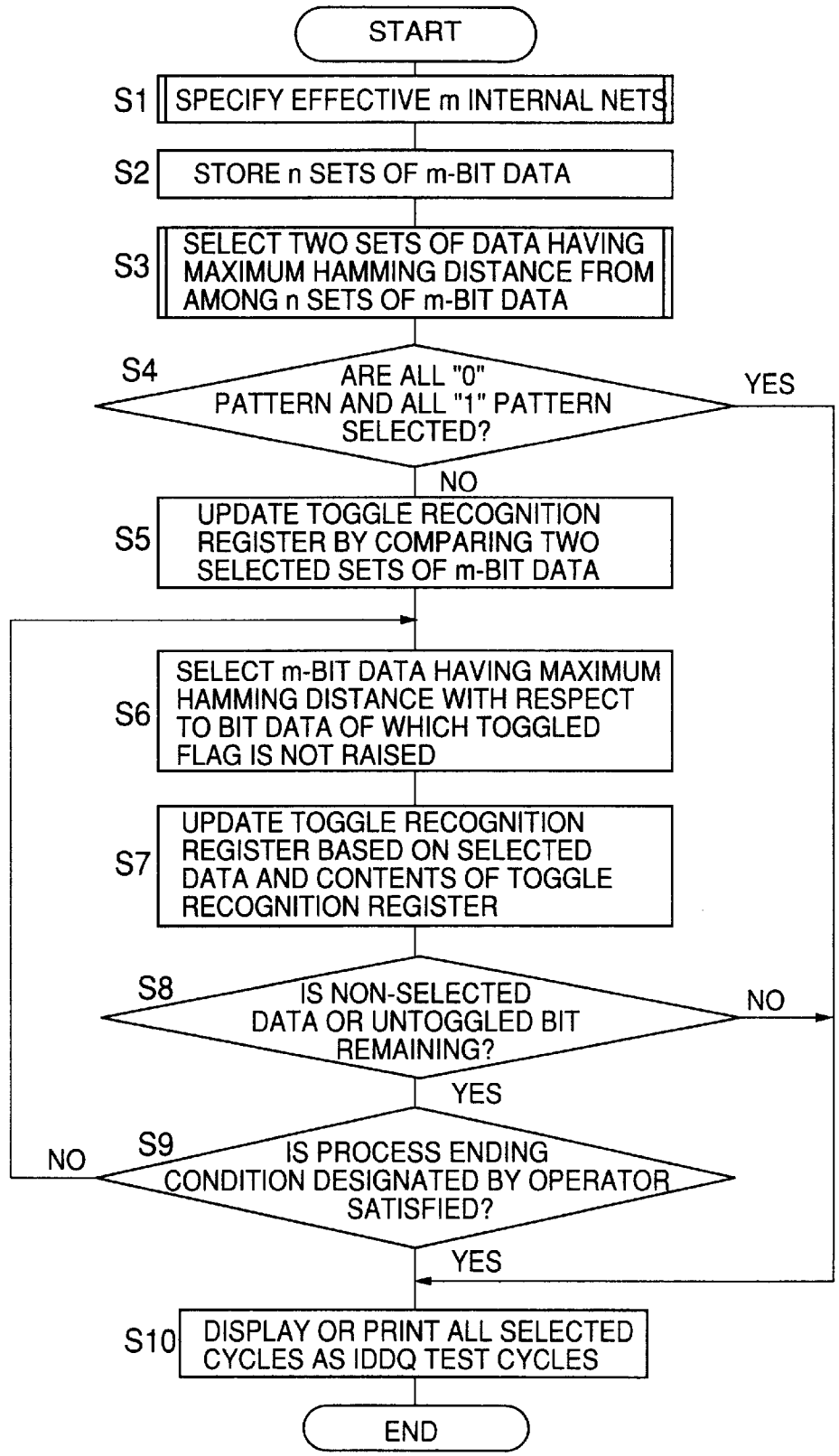
FIG. 3 is a flowchart of a process for selecting IDDQ test cycles which is performed by a data processing device shown in FIG. 2.

FIG. 3 is a flowchart of the process for selecting the IDDQ test cycles which is performed by the data processing device 203. A description will now be given, with reference to FIG. 3, of the process for selecting the IDDQ test cycles.

When the process is started, the m internal nets to be subjected to the IDDQ test cycle selecting process are specified, in step S1, based on the information with respect to the internal nets of the CMOS integrated circuit which information is supplied by the logical simulation apparatus 100. The process of step 1 will be described in detail later. In step S2, n standby cycles are detected from among operation cycles with respect to the m internal nets specified in step S1. The logical values of the internal nets in each of the detected standby cycles are arranged in a predetermined order so as to form m-bit data. The thus-formed m-bit data is stored in the storage device 202.

The n sets of m-bit data are stored in the storage device 202 with data indicating a position of the operation cycle from the first operation cycle of the logical simulation. Each m-bit data is provided with an identification number from 1 to n starting from one which appears first in the sequence of the logical simulation. Since a technique for determining whether or not a standby state is achieved in an operation cycle is known, for example, in Japanese Laid-Open Patent Application No.4-44172, descriptions thereof will be omitted.

In step S3, two sets of m-bit data are selected from among n sets of m-bit data stored in the storage device 202, the two sets of m-bit data having a maximum Hamming distance therebetween. A detail of the process of step S3 will be described later with reference to FIG. 11. It is then determined, in step S4, whether or not all bits of one of the two sets of m-bit data are "0" and all bits of the other of the two sets of m-bit data are "1". If the determination of step S4 is affirmative, the IDDQ test can be performed on all of the m internal nets while a value of each bit is set to both "0" and "1" by using solely the two sets of m-bit data. That is, the IDDQ test can be performed by the two sets of m-bit data. Thus, in this case, the routine skips steps S5 to S9 and proceeds to step S10 so as to print the result of the IDDQ test cycle selecting process.

On the other hand, if it is determined, in step S4, that the bits of at least one of the two sets of m-bit data are not all "0" or "1", it is determined that the two sets of m-bit data are not sufficient for performing an accurate IDDQ test. In this case, the routine proceeds to step S5.

Figure 4:
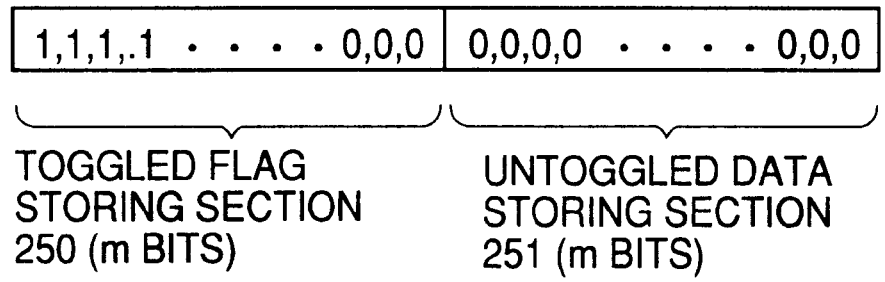
FIG. 4 is an illustration of a toggle recognition register.

In step S5, the two sets of m-bit data are compared with each other on an individual bit basis, and values of a toggle recognition register are updated in accordance with the a result of the comparison. The toggle recognition register is a 2×m-bit register, as shown in FIG. 4, which comprises a toggled flag storing section 250 having m bits and an untoggled data storing section 251 having m bits. The toggle recognition register is formed in the memory of the data processing device 203. Each toggled flag takes a value of either "0" or "1", and is set to the value "1" when it is determined that the corresponding bit has been toggled. The toggled flag storing section 250 stores values of the toggled flags each of which indicates that the corresponding bit has been toggled. The untoggled data storing section 251 stores bit values of untoggled data each of which has not been toggled. That is, if one of two bits which are compared with each other in step S5 is "1" and the other is "0", a corresponding bit in the toggled flag storing section 250 is set to be "1". If the values of the two bits are both "1" or both "0", a corresponding bit in the toggled flag storing section 250 is set to be "0" and the value of the two bits is set to the corresponding bit in the untoggled data storing section.

Then, attention is given to data corresponding to the toggled flags having the values of "0". In step S6, data formed by arranging bits corresponding to the toggled flags having the value of "0" are compared with data formed by arranging bits corresponding to the position of the toggled flags having the value of "0" in each of a plurality of sets of m-bit data which have not been selected, and the m-bit data which has a maximum Hamming distance is selected.

A description will now be given of the process of step S6 in detail. It is assumed that the bit arrangement of the two sets of the m-bit data selected in step S3 are "11111110 . . . 000" and "00000001 . . . 000", and the toggled flags are set as "11111111 . . . 000" in step S5. In this case, attention is given to 3-bit data "000" corresponding to the toggled flags having the value "0". That is, one of m-bit data having 3-bit data having a maximum Hamming distance from the 3-bit data corresponding to the position of the 3-bit data "000" is selected from among a plurality of sets of m-bit data which have not been selected. For example, if there is m-bit data "xxxxxxx . . . 111" (x is an arbitrary value), this m-bit data is selected.

In step S7, the data formed by arranging bits corresponding to the toggled flags having the value of "0" is compared with the data formed by arranging bits corresponding to the position of the toggled flags having the value of "0" in the m-bit data selected in step S6 so as to update values of the toggled flags corresponding to the positions of the toggled flags having the value of "0".

It is then determined, in step S8, whether or not there is a toggled flag which has not been set to the value "1" or whether or not there is m-bit data which has not been selected yet. If it is determined that there is a toggled flag which has not been set to the value "1" or there is m-bit data which has not been selected yet, the routine proceeds to step S9. In step S9, it is determined whether or not a process ending condition designated by the operator is satisfied. If it is determined that the process ending condition is not satisfied, the routine returns to step S6 so as to continue the process.

On the other hand, if it is determined, in step S8, that values of all of the toggled flags have been set to "1" or the n sets of m-bit data have been selected, the routine proceeds to step S10 so as to print the result of the process.

Additionally, even if the determination of step S8 is affirmative, if it is determined, in step S9, that the process ending condition designated by the operator is satisfied, the routine proceeds to step S10 so as to print the result of the process. In step S10, the selected cycles are rendered to be the IDDQ test cycles, and the information indicating positions of the IDDQ test cycles from the first operation cycle of the logical simulation is displayed on the display 204 and also printed by the printer 205.

Figure 5:
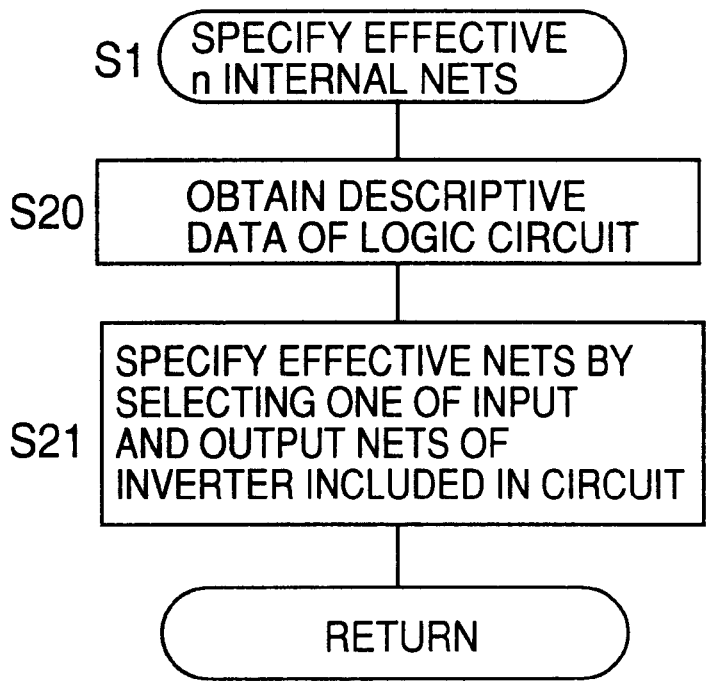
FIG. 5 is a flowchart of the process of step S3 shown in FIG. 3 which is performed for specifying m internal nets to be subjected to the IDDQ test.

FIG. 5 is a flowchart of the process of step S1 shown in FIG. 3 which is performed for specifying the m internal nets to be subjected to the IDDQ test based on the information regarding the internal nets of the logic circuit to be processed which is supplied by the logical simulation apparatus 100. When the process is started, descriptive data which represents the structure of the CMOS integrated circuit to be processed or the information regarding the internal nets is requested from the logical simulation apparatus 100. The IDDQ test cycle selecting system 150 receives the descriptive data or the information regarding the internal nets in step S20. Then, in step S21, only one of an input net and an output net of each inverter included in the circuit is rendered to be subjected to the IDDQ test, the m internal nets to be subjected to the IDDQ test are specified, and the process is ended.

Figure 6:
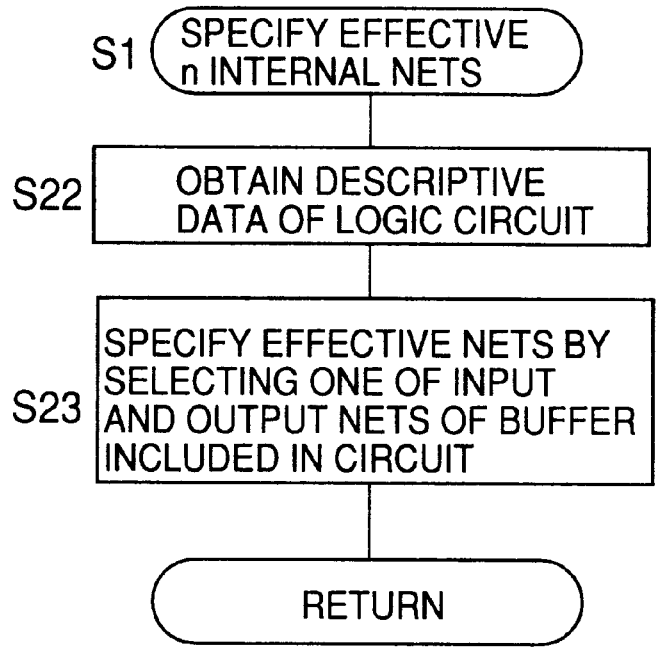
FIG. 6 is a flowchart of a first variation of the process for specifying the m internal nets to be subjected to the IDDQ test.

FIG. 6 is a flowchart of a first variation of the process of step S1 for specifying m internal nets to be subjected to the IDDQ test. When the process is started, descriptive data which represents the structure of the CMOS integrated circuit to be processed or the information regarding the internal nets is requested from the logical simulation apparatus 100. The IDDQ test cycle selecting system 150 receives the descriptive data or the information regarding the internal nets in step S22. Then, in step S23, only one of an input net and an output net of each buffer included in the circuit is rendered to be subjected to the IDDQ test, the m internal nets to be subjected to the IDDQ test are specified, and the process is ended.

Figure 7:
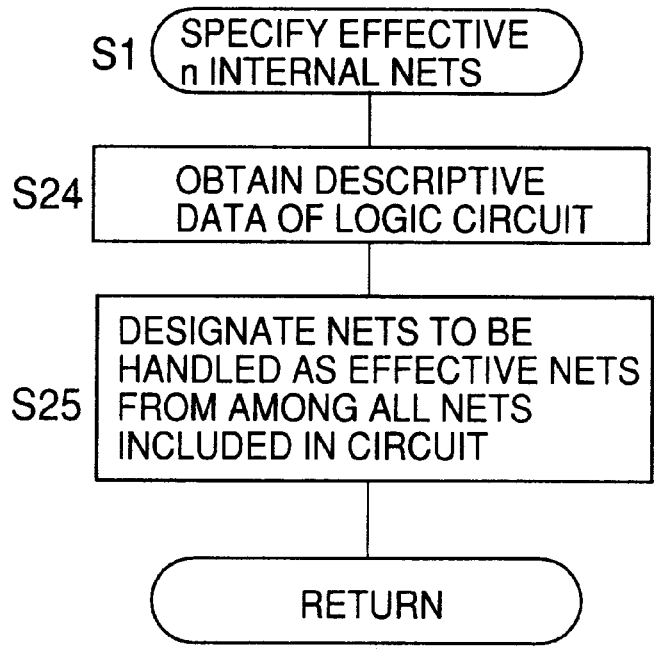
FIG. 7 is a flowchart of a second variation of the process for specifying the m internal nets to be subjected to the IDDQ test.

FIG. 7 is a flowchart of a second variation of the process of step S1 for specifying m internal nets to be subjected to the IDDQ test. When the process is started, descriptive data which represents the structure of the CMOS integrated circuit to be processed or the information regarding the internal nets is requested from the logical simulation apparatus 100. The IDDQ test cycle selecting system 150 receives the descriptive data or the information regarding the internal nets in step S24. Then, in step S25, m internal nets, which are designated by the operator, are selected from among the M internal nets which are included in the entire logic circuit, and the m internal nets are rendered to be subjected to the IDDQ test.

Figure 8:
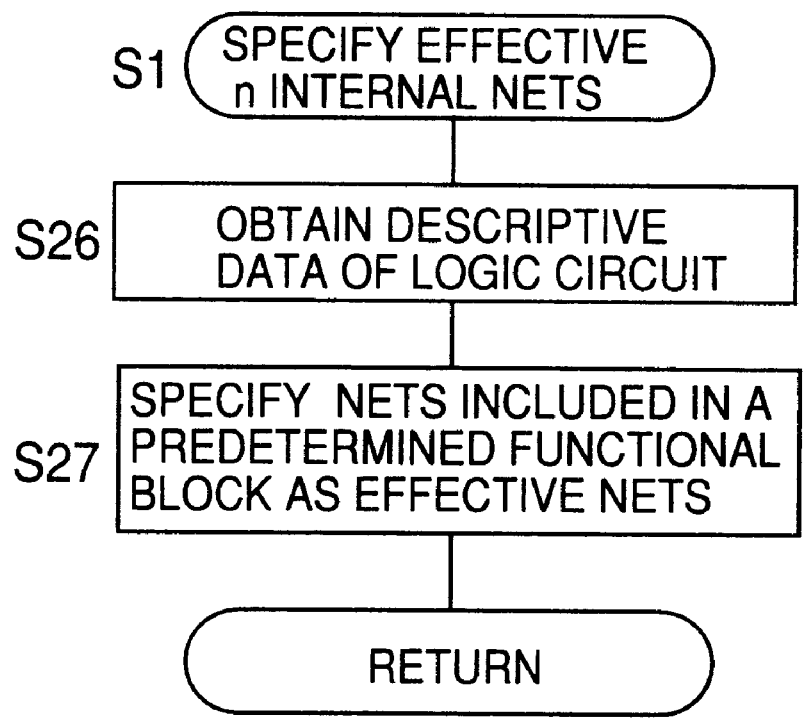
FIG. 8 is a flowchart of a third variation of the process for specifying the m internal nets to be subjected to the IDDQ test.

FIG. 8 is a flowchart of a third variation of the process of step S1 for specifying m internal nets to be subjected to the IDDQ test. When the process is started, descriptive data which represents the structure of the CMOS integrated circuit to be processed or the information regarding the internal nets is requested from the logical simulation apparatus 100. The IDDQ test cycle selecting system 150 receives the descriptive data or the information regarding the internal nets in step S26. Then, in step S27, m internal nets, which are included in a previously designated functional block of the logic circuit, are selected from among the M internal nets which are included in the entire logic circuit, and the m internal nets are rendered to be subjected to the IDDQ test.

Additionally, in step S27, the m internal nets to be subjected to the IDDQ test may not be included in a functional block but included in predetermined level of a hierarchical structure.

Figure 9A:
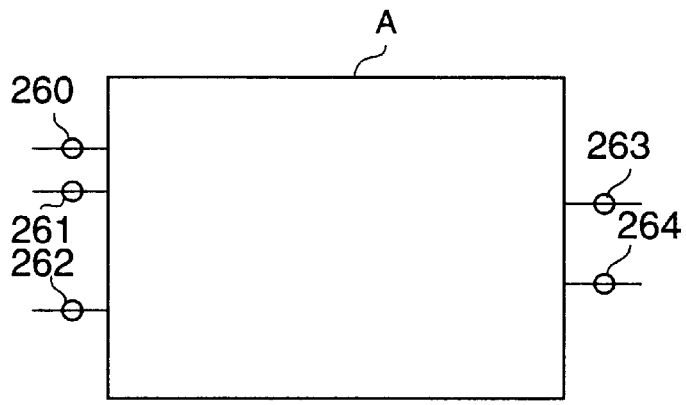
FIGS. 9A is an illustration for showing a functional block included in a logic circuit.
Figure 9B:
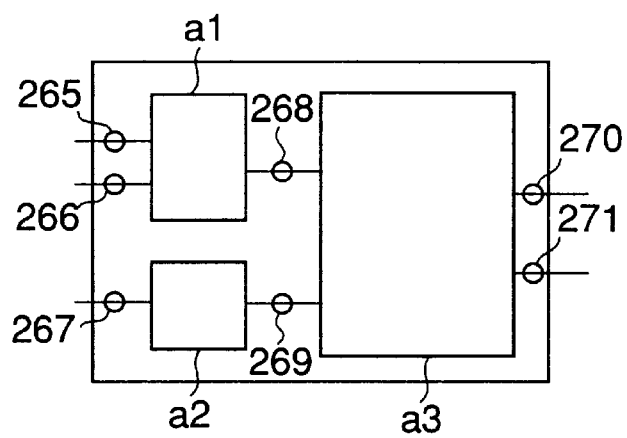
FIG. 9B is an illustration for showing sub-blocks included in the functional block shown in FIG. 9A.
Figure 9C:
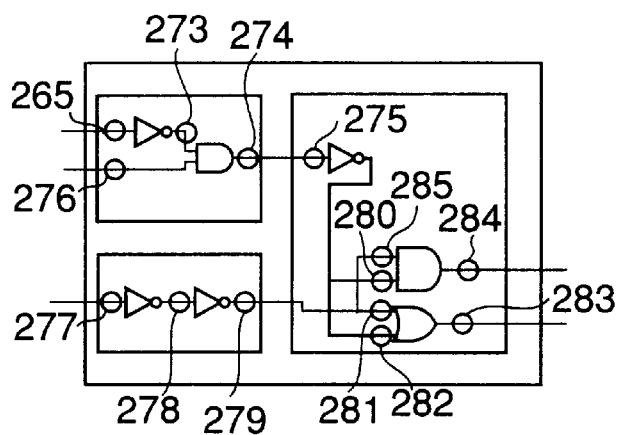
FIG. 9C is an illustration for showing elements included in the sub-blocks shown in FIG. 9B.

A description will now be given, with reference of FIGS. 9A, 9B and 9C, of the detail of the above-mentioned third variation of the process. FIG. 9A is an illustration for showing a functional block A in the logic circuit; FIG. 9B is an illustration for showing sub-blocks included in the functional block A shown in FIG. 9A; FIG. 9C is an illustration for showing elements included in the sub-blocks shown in FIG. 9B.

If the operator designates the functional block A shown in FIG. 9A, all of the internal nets 265 to 285 shown in FIG. 9B and FIG. 9C are selected as the internal nets to be subjected to the IDDQ test. If one of the sub-blocks a1, a2 and a3 shown in FIG. 9B is designated, all of the internal nets included in the selected sub-block are selected as the internal nets to be subjected to the IDDQ test. For example, if the sub-block a1 is designated, the internal nets 272, 273, 274 and 276 are selected as the internal nets to be subjected to the IDDQ test.

On the other hand, if the level of the hierarchical structure in which the functional block A shown in FIG. 9A is included is designated, the internal nets 260 to 264 shown in FIG. 9A are selected as the internal nets to be subjected to the IDDQ test. Additionally, if the level of the hierarchical structure in which the sub-blocks a1, a2 and a3 are included is designated, the internal nets 265 to 271 shown in FIG. 9B are selected as the internal nets to be subjected to the IDDQ test.

FIG. 10 is a flowchart of a fourth variation of the process of step S1 for specifying m internal nets to be subjected to the IDDQ test. When the process is started, descriptive data which represents the structure of the CMOS integrated circuit to be processed or the information regarding the internal nets is requested from the logical simulation apparatus 100. The IDDQ test cycle selecting system 150 receives the descriptive data or the information regarding the internal nets in step S28. Then, in step S29, m internal nets, which are included in a power-supply system previously designated by the operator, are selected from among the M internal nets which are included in the entire logic circuit, and the selected m internal nets are rendered to be subjected to the IDDQ test.

FIG. 11 is a flowchart of the process of step S3 for selecting two sets of m-bit data from among n sets of m-bit data stored in the storage device 202, the two sets of m-bit data being regarded as having an approximately maximum Hamming distance therebetween.

First, in step S31, sets of m-bit data including a maximum number of bits which are set to "1" and sets of m-bit data including a maximum number of bits which are set to "0" are selected from among the n sets of m-bit data stored in the storage device 202. Then, in step S32, one set of m-bit data is selected from among the m-bit data including the maximum number of bits which are set to "1", the one set of m-bit data representing a maximum value. Additionally, one set of m-bit data is selected from among the m-bit data including the maximum number of bits which are set to "0", the one set of m-bit data representing a minimum value.

The two sets of m-bit data selected in the above-mentioned process do not always have the maximum Hamming distance therebetween. However, it takes a long time to investigate a Hamming distance for all combinations of the sets of m-bit data. Accordingly, the above-mentioned process has an advantage in that two sets of m-bit data having an approximately maximum Hamming distance therebetween can be selected in a much shorter time. It should be noted that, in the above-mentioned process, if there are two sets of m-bit data in which the bits of one are all set to "1" and the bits of the other are all set to "0", these two sets of m-bit data are always selected.

Figure 12:
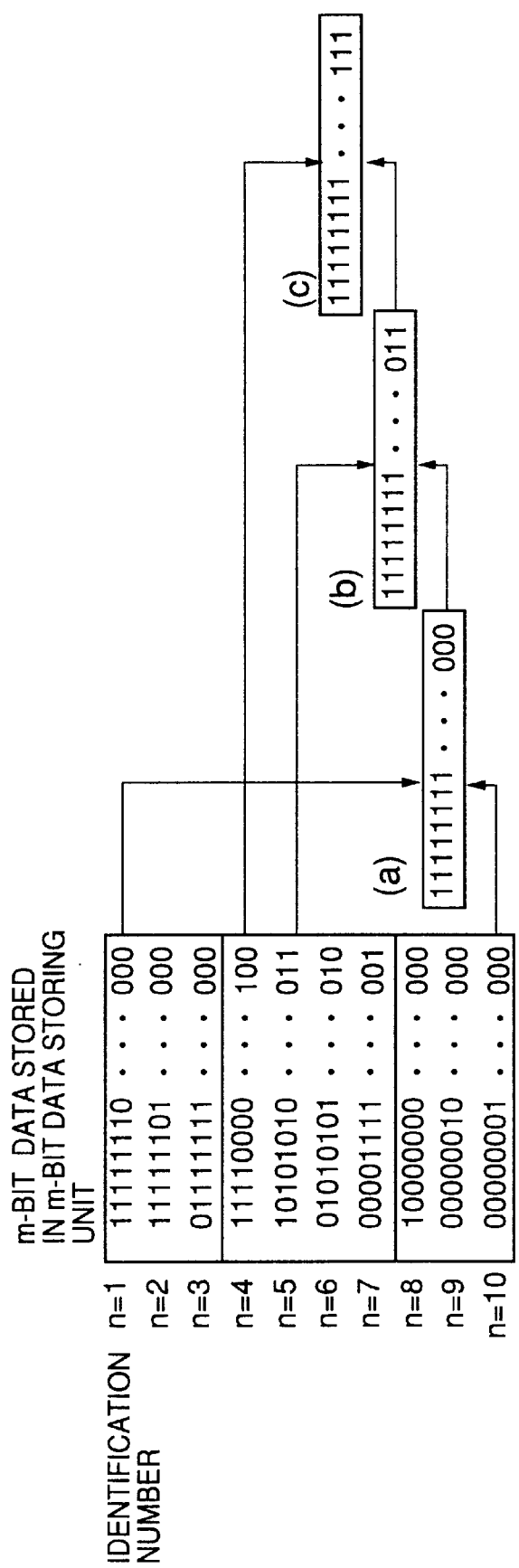
FIG. 12 is an illustration for explaining execution of a process for selecting the IDDQ test cycles.

FIG. 12 is an illustration for explaining execution of the process shown in FIG. 3 for selecting the IDDQ test cycles. In the example of FIG. 12, ten sets of m-bit data, which are determined as standby cycles, are selected from among the internal nets included in the CMOS integrated circuit by performing logical simulation, and the selected n sets of m-bit data are stored in the storage device 202.

First, two sets of m-bit data having a maximum Hamming distance therebetween are selected from among the ten sets of m-bit data in the process of step S3 as described above. As a result, the m-bit data provided with the identification number n=1 and the m-bit data provided with the identification number n=10 are selected. That is, all bits of each of the selected two sets of m-bit data excluding the three least significant bits are in a toggled relationship in which one of a pair of bits is "1" and the other is "0". Accordingly, as shown by (a) in FIG. 12, all bits of the toggled flag storing section 250 excluding three bits corresponding to the three least significant bits of the selected sets of m-bit data are set to "1". Additionally, the three least significant bits "000" of one of the two selected m-bit data having the identification numbers n=1 and n=10 are stored in the corresponding positions of the untoggled data storing section 251 of the toggle recognition register.

Thereafter, one set of m-bit data is selected from among the sets of m-bit data which have not been selected so that the three least significant bits of the selected one set of m-bit data has a maximum Hamming distance from the three least significant bits "000" of one of the two m-bit data provided with the identification numbers n=1 and n=10. In the example shown in FIG. 12, the m-bit data provided with the identification number n=5 which has the three least significant bits "011" is selected. Then, as shown by (b) in FIG. 12, the two least significant bits of the toggled flag storing section 250 of the toggle recognition register are set to "1" in accordance with the three least significant bits of the m-bit data provided with the identification number n=5.

Finally, the m-bit data provided with the identification number n=4 is selected which has a maximum Hamming distance from the third least significant bit "0" of the m-bit data provided with the identification number n=5. That is, the third least significant bit of the m-bit data provided with the identification number n=4 is "1". By selecting the m-bit data provided with the identification number n=4, all of the bits of the toggled flag storing section 250 in the toggle recognition register are set to "1" as shown by (c) in FIG. 12.

After all of the bits of the toggled flag storing section 250 in the toggle recognition register are set to "1", the operation cycles corresponding to the four used sets of m-bit data (n=1, 4, 5, 10) are determined to be the IDDQ test cycles which are to be subjected to the IDDQ test. Then, information indicating positions of the selected IDDQ test cycles from the operation cycle at which the logical simulation is started is displayed on the display 204 and also printed by the printer 205.

As mentioned above, according to the IDDQ test cycle selecting method according to the first embodiment of the present invention, a combination of the minimum number of sets of m-bit data can be selected as the IDDQ test cycles so that each of the m bits which indicate the state of the corresponding m internal nets takes both values "0" and "1" at least once.

A description will now be given of a second embodiment of the present invention.

In the above-mentioned first embodiment, the IDDQ test cycles are selected after the logical simulation of the operation of the CMOS integrated circuit has been completed by the logical simulation apparatus. On the other hand, a method according to the second embodiment of the present invention selects the IDDQ test cycles while the logical simulation of the CMOS integrated circuit is being performed.

Figure 13:
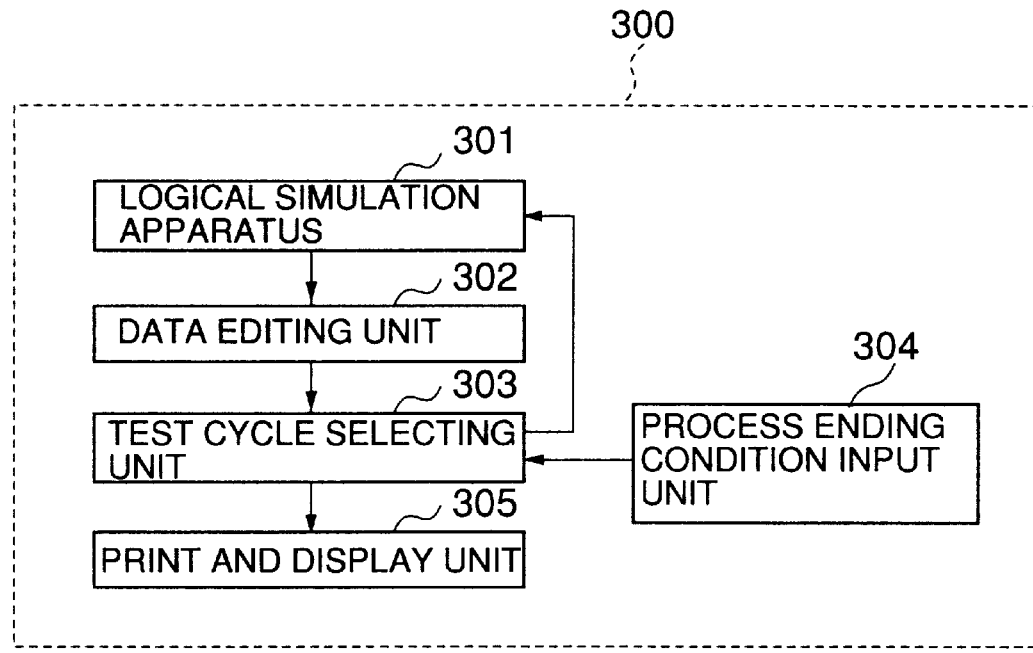
FIG. 13 is a block diagram of an IDDQ test cycle selecting system which performs an IDDQ test cycle selecting method according to a second embodiment of the present invention.

FIG. 13 is a block diagram of an IDDQ test cycle selecting system 300 which performs the IDDQ test cycle selecting method according to the second embodiment of the present invention.

In the IDDQ test cycle selecting system 300 shown in FIG. 13, a logical simulation apparatus 301 performs a simulation of an operation of a CMOS integrated circuit described with HDL (Hardware Description Language) in accordance with a timing control by a test cycle selecting unit 303 so as to output results of the simulation to a data editing unit 302 on an individual cycle basis.

The data editing unit 302 receives the information from the logical simulation apparatus 301. The data editing unit 302 specifies m internal nets from among M internal nets of the entire circuit so that the m internal nets are subjected to a process for selecting the IDDQ test cycles. The data editing unit 302 outputs m-bit data which represents a signal state of each of the specified m internal nets. It should be noted that the data editing unit 302 performs a process the same as the process performed by the data editing unit 151 provided in the IDDQ test cycle selecting system 150 shown in FIG. 1, and a description thereof will be omitted.

The test cycle selecting unit 303 determines a set of m-bit data as the IDDQ test cycle only when the set of m-bit data, which is supplied via the data editing unit 302, satisfies a predetermined condition with respect to a Hamming distance from the m-bit data corresponding to the cycle extracted immediately before. The test cycle selecting unit 303 sends an instruction to the logical simulation apparatus 301 after the determination for one operation cycle is completed.

A process ending condition input unit 304 is a man-machine interface for externally setting a condition for selecting the IDDQ test cycles used in the IDDQ test performed by the test cycle selecting unit 303. The process ending condition input unit 304 also sets a condition for ending the process for selecting IDDQ test cycles.

A print and display unit 305 prints or displays information indicating a position of each of the standby cycles selected by the test cycle selecting unit 303, the position being counted from a first operation cycle in the logical simulation.

Figure 14:
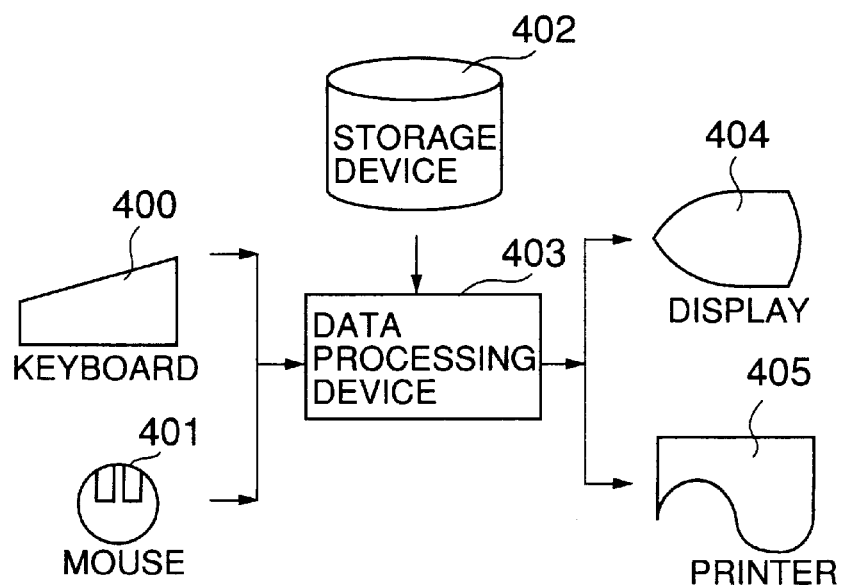
FIG. 14 is an illustration showing a hardware structure of the IDDQ test cycle selecting system shown in FIG. 13.

FIG. 14 is an illustration showing a hardware structure of the IDDQ test cycle selecting system 300. As shown in FIG. 14, the IDDQ test sample selecting system 300 comprises a keyboard 400, a mouse 401, a storage device 402, a data processing device 403, a display 404 and a printer 405.

The keyboard 400 and the mouse 401 together serve as the process ending condition input unit 304 shown in FIG. 13. The data processing device 403 comprises a central processing unit (CPU) and a memory for storing programs of a process for selecting the IDDQ test cycles. The CPU of the data processing device 403 executes the programs of the process for selecting the IDDQ test cycles stored in the memory so as to serve as the data editing unit 302 and the test cycle selecting unit 303. The display 404 and the printer 405 serve as the print and display unit 305 shown in FIG. 13.

Figure 15:
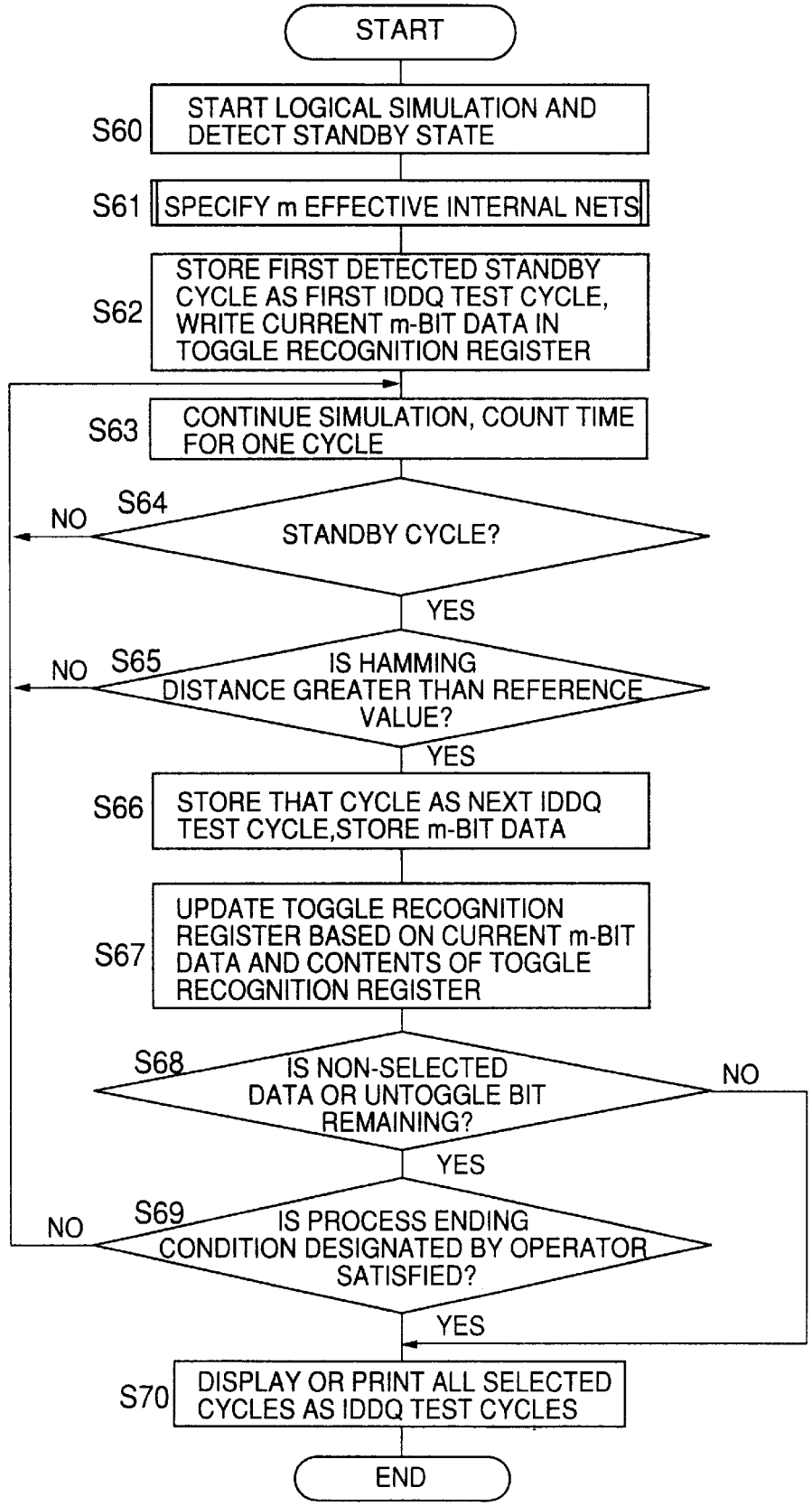
FIG. 15 is a flowchart of a process for selecting IDDQ test cycles which is performed by a data processing device shown in FIG. 14.

FIG. 15 is a flowchart of the process for selecting the IDDQ test cycles which is performed by the data processing device 403. A description will now be given, with reference to FIG. 15, of the process for selecting the IDDQ test cycles.

When the process of FIG. 15 is started, simulation of an operation of a CMOS integrated circuit is started by the logical simulation apparatus 301, in step S60, so as to detect the first standby cycle by checking a state of each net of the circuit in each operation cycle. Then, in step S61, m internal nets to be subjected to the IDDQ test are specified based on the information regarding the internal nets of the CMOS integrated circuit supplied by the logical simulation apparatus 301. The logic values of the m internal nets are arranged in a predetermined order so as to form a set of M-bit data, and the data is output to the data editing unit 302. It should be noted that the contents of the process are the same as the contents of the process of step S1 shown in FIG. 3 which is performed by the data processing device 203, and a description thereof will be omitted.

In step S62, a standby cycle which is detected first is rendered to be a first IDDQ test cycle, and information regarding a position of the first IDDQ test cycle from the first operation cycle in the simulation and information indicating that the IDDQ test cycle is selected first are stored in the storage device 402. Additionally, the m-bit data corresponding to the selected cycle is also stored in the storage device 402. Further, the data in the toggle recognition register is reset. It should be noted that a structure of the toggle recognition register is the same as that shown in FIG. 4, and a description thereof will be omitted.

Thereafter, in step S63, the logical simulation is continued, and a time count is proceeded by one cycle. It is then determined, in step S64, whether or not the immediately proceeding cycle is a standby cycle. If it is determined that the immediately proceeding cycle is not a standby cycle, the routine returns to step S63 so as to perform the logical simulation on a subsequent cycle.

On the other hand, if the immediately proceeding cycle is a standby cycle, the routine proceeds to step S65. In step S65, it is determined whether a Hamming distance between the m-bit data corresponding to the standby cycle determined in step S64 and the immediately preceding standby cycle is greater than a predetermined reference value. At this time, the determination of the Hamming distance is based on only the data corresponding to the bit positions for which toggled flags are "0".

If it is determined that the Hamming distance is not greater than the reference value, the routine returns to S63 so as to continue the logical simulation for the subsequent cycle. The above-mentioned reference value is changed according to a predetermined schedule in response to a number of bits corresponding to the toggled flags which are set to "0". For example, if the number of bits corresponding to the toggled flags set to "0" is P (m≧p), the reference value is set to p−2. It should be noted that the reference value is set to 1 if P≦2.

On the other hand, if it is determined, in step S64, that the current cycle is a standby cycle, and if it is determined, in step S65, that the Hamming distance is greater than the reference value, the current cycle is selected as the next IDDQ test cycle in step S66. Then, information regarding the position of the selected IDDQ test cycle from the first operation cycle in the simulation and information indicating that the IDDQ test cycle is selected second are stored in the storage device 402. Additionally, the m-bit data corresponding to the selected cycle is also stored in the storage device 402.

Thereafter, in step S67, the m-bit data corresponding to the IDDQ test cycle selected in step S66 is compared with the m-bit data corresponding to the IDDQ test cycle selected immediately before by referring to the bits of which positions correspond to the bits in the toggled flag storing section 250 of the toggle recognition register which are set to "0". The bit data of the toggled flag storing section is updated in accordance with a result of the comparison.

It is then determined, in step S68, whether or not there is a toggled flag which has not been set to the value "1" or whether or not there is m-bit data which has not been selected yet. If it is determined that there is a toggled flag which has not been set to the value "1" or there is m-bit data which has not been selected yet, the routine proceeds to step S69. In step S69, it is determined whether or not a process ending condition designated by the operator is satisfied. If it is determined that the process ending condition is not satisfied, the routine returns to step S63 so as to continue the process.

On the other hand, if it is determined, in step S68, that values of all of the toggled flags have been set to "1" or the n sets of m-bit data have been selected, the routine proceeds to step S70 so as to print the result of the process.

Additionally, even if the determination of step S68 is affirmative, if it is determined, in step S69, that the process ending condition designated by the operator is satisfied, the routine proceeds to step S70 so as to print the result of the process. In step S70, the selected cycles are rendered to be the IDDQ test cycles, and the information indicating positions of the IDDQ test cycles from the first operation cycle of the logical simulation is displayed on the display 404 and is also printed by the printer 405.

As mentioned above, the IDDQ test cycle selecting system 300 selects the IDDQ test cycles in association with the progress of the simulation performed by the logical simulation apparatus 301. Thus, the process for selecting the IDDQ test cycles is completed at the same time the logical simulation is completed. Thereby, a process time can be reduced.

The present invention is not limited to the specifically disclosed embodiments, and variations and modifications may be made without departing from the scope of the present invention.

The present application is based on Japanese priority application No.9-229273 filed on Aug. 26, 1997, the entire contents of which are hereby incorporated by reference.

What is claimed is:

1. A method for selecting IDDQ test cycles by performing a logical simulation of an operation of an integrated circuit including a plurality of internal nets, the method comprising the steps of:

a) detecting operation cycles which are in a standby state from among operation cycles in the logical simulation;

b) storing n sets of m-bit data corresponding to the operation cycles detected in step a), each set of m-bit data comprising m bits representing a state of the respective m internal nets included in said integrated circuit;

c) preparing a toggled flag for each of the m bits of the set of m-bit data, the toggled flag indicating whether the corresponding bit of the set of m-bit data has been set to both values "0" and "1" at least once;

d) selecting two sets of m-bit data from among the n sets of m-bit data so that the two sets of m-bit data have a maximum Hamming distance therebetween;

e) setting the toggled flag by comparing the first set of m-bit data with the second set of m-bit data so that the toggled flag is raised for each bit of which a value is changed from one of the values "0" and "1" to the other between the two sets of m-bit data;

f) detecting each bit of the set of m-bit data for which the toggled flag is not raised so as to recognize bit positions at which each bit has not been changed from one of the values "0" and "1" to the other;

g) selecting one of the n sets of m-bit data other than the previously selected sets of m-bit data, the one of the n sets of m-bit data including a set of bits at the recognized bit positions having a maximum Hamming distance from the set of bits at the bit positions recognized in step f);

h) updating the toggled flag by comparing the set of bits of the one of n sets of m-bit data selected in step g) with the set of bits at the bit positions recognized in step f) so that the toggled flag is raised for each bit of which a value is changed from one of the values "0" and "1" to the other;

i) repeating steps f), g) and h) until a predetermined condition is satisfied; and j) rendering the operation cycles corresponding to the previously selected sets of m-bit data to be the IDDQ test cycles.

2. The method as claimed in claim 1, wherein step d) comprises the steps of:

d-1) selecting one of the n sets of m-bit data which includes a maximum number of bits having the value "1" and another one of the n sets of m-bit data which includes a maximum number of bits having the value "0"; and d-2) proceeding to step j) when all bits included in the one of the n sets of m-bit data have the value "1" and all bits included in the another one of the n sets of m-bit data have the value "0";

d-3) selecting one of n sets of m-bit data representing a maximum value from among a plurality of sets of m-bit data each of which is selected as having the maximum number of bits having the value "1" in step d-1), and selecting one of n sets of m-bit data representing a minimum value from among a plurality of sets of m-bit data each of which is selected as having the maximum number of bits having the value "0" in step d-1).

3. The method as claimed in claim 1, wherein step i) comprises the step of:

repeating steps f), g) and h) until a number of raised toggled flags exceeds a predetermined value.

4. The method as claimed in claim 1, wherein step i) comprises the step of:

repeating steps f), g) and h) until a predetermined number of sets of m-bit data are selected in steps d) and g).

5. The method as claimed in claim 1, further comprising the steps of:

detecting inverters included in said integrated circuit; and including only one of an input net and an output net of each of the inverters in the m internal nets.

6. The method as claimed in claim 1, further comprising the steps of:

detecting buffers included in said integrated circuit; and including only one of an input net and an output net of each of the buffers in the m internal nets.

7. The method as claimed in claim 1, further comprising the steps of:

designating internal nets to be included in the m internal nets; and storing m-bit data comprising m bits each of which represents a state of a respective one of the m internal nets.

8. The method as claimed in claim 1, further comprising the steps of:

designating a functional block included in said integrated circuit; and storing m-bit data comprising m bits each of which represents a state of a respective one of the m internal nets included in said functional block.

9. The method as claimed in claim 1, further comprising the steps of:

designating a hierarchical level of said integrated circuit; and storing m-bit data comprising m bits each of which represents a state of a respective one of the m internal nets included in said hierarchical level of said integrated circuit.

10. The method as claimed in claim 1, further comprising the steps of:

designating a power-supply system in said integrated circuit; and storing m-bit data comprising m bits each of which represents a state of a respective one of the m internal nets included in said power-supply system in said integrated circuit.

11. The method as claimed in claim 1, wherein step a) comprises the step of:

designating operational cycles to be subjected to the IDDQ test; and detecting operation cycles which are in a standby state from among the designated operation cycles.

12. A method for selecting IDDQ test cycles by performing a logical simulation of an operation of an integrated circuit including a plurality of internal nets, the method comprising the steps of:

a) performing a logical simulation of an operation of said integrated circuit;

b) determining whether an operation cycle in the logical simulation is in a standby state, a determination being performed on an individual operation cycle basis;

c) selecting a first IDDQ test cycle which is determined to be in the standby state first;

d) storing a set of m-bit data corresponding to said first IDDQ test cycle as a reference set of m-bit data, the set of m-bit data comprising a number of bits corresponding to the number of internal nets included in said integrated circuit;

e) setting a reference value with respect to a Hamming distance in accordance with a set of m-bit data which comprises a number of bits corresponding to the number of internal nets included in said integrated circuit;

f) continuing the logical simulation and selecting a second IDDQ test cycle which is determined to be in the standby state, a set of m-bit data corresponding to said second IDDQ test cycle having a Hamming distance greater than said reference value with respect to the set of m-bit data corresponding to said first IDDQ test cycle;

g) preparing a toggled flag for each of the m bits of the reference set of m-bit data, the toggled flag indicating whether the corresponding bit of the reference set of m-bit data has been set to both values "0" and "1" at least once;

h) storing the set of m-bit data corresponding to said second IDDQ test cycle as the reference set of m-bit data;

i) setting the toggled flag by comparing the set of m-bit data corresponding to said first IDDQ test cycle with the set of m-bit data corresponding to said second IDDQ test cycle so that the toggled flag is raised for each bit of which a value has been changed from one of the values "0" and "1" to the other between the two sets of m-bit data;

j) detecting each bit of the reference set of m-bit data for which the toggled flag is not raised so as to recognize bit positions at which each bit has not been changed from one of the values "0" and "1" to the other;

k) selecting a next IDDQ test cycle which is determined to be in the standby state, a set of m-bit data corresponding to the next IDDQ test cycle at the recognized bit positions having a Hamming distance greater than said reference value with respect to the reference set of m-bit data at the recognized bit positions;

l) updating the toggled flag by comparing the set of m-bit data corresponding to the next IDDQ test cycle with the reference set of m-bit data so that the toggled flag is raised for each bit of which a value has been changed from one of the values "0" and "1" to the other;

m) storing the set of m-bit data corresponding to the next IDDQ test cycle as the reference set of m-bit data; and n) repeating steps j), k), l) and m) until a predetermined condition is satisfied.

13. The method as claimed in claim 12, wherein step n) comprises the step of:

repeating steps j), k), l) and m) until a number of raised toggled flags exceeds a predetermined value.

14. The method as claimed in claim 12, wherein step n) comprises the step of:

repeating steps j), k), l) and m) until a predetermined number of IDDQ test cycles are selected.

15. The method as claimed in claim 12, further comprising the steps of:

detecting inverters included in said integrated circuit; and including only one of an input net and an output net of each of the inverters in the m internal nets.

16. The method as claimed in claim 12, further comprising the steps of:

detecting buffers included in said integrated circuit; and including only one of an input net and an output net of each of the buffers in the m internal nets.

17. The method as claimed in claim 12, further comprising the step of:

designating internal nets to be included in the m internal nets.

18. The method as claimed in claim 12, further comprising the steps of:

designating a functional block included in said integrated circuit; and storing m-bit data comprising m bits each of which represents a state of a respective one of the m internal nets included in said functional block.

19. The method as claimed in claim 12, further comprising the steps of:

designating a hierarchical level of said integrated circuit; and storing m-bit data comprising m bits each of which represents a state of a respective one of the m internal nets included in said hierarchical level of said integrated circuit.

20. The method as claimed in claim 12, further comprising the steps of:

designating a power-supply system in said integrated circuit; and storing m-bit data comprising m bits each of which represents a state of a respective one of the m internal nets included in said power supply system in said integrated circuit.

21. The method as claimed in claim 12, wherein step a) comprises the step of:

designating operational cycles to be subjected to the IDDQ test; and performing the logical simulation for the designated operation cycles.

22. A processor readable medium storing program code means for causing a computer to select IDDQ test cycles by performing a logical simulation of an operation of an integrated circuit including a plurality of internal nets, comprising:

first program code means for detecting operation cycles which are in a standby state from among operation cycles in the logical simulation;

second program code means for storing n sets of m-bit data corresponding to the operation cycles detected by the first program code means, each set of m-bit data comprising m bits representing a state of the respective m internal nets included in said integrated circuit;

third program code means for preparing a toggled flag for each of the m bits of the set of m-bit data, the toggled flag indicating whether the corresponding bit of the set of m-bit data has been set to both values "0" and "1" at least once;

fourth program code means for selecting two sets of m-bit data from among the n sets of m-bit data so that the two sets of m-bit data have a maximum Hamming distance therebetween;

fifth program code means for setting the toggled flag by comparing the first set of m-bit data with the second set of m-bit data so that the toggled flag is raised for each bit of which a value is changed from one of the values "0" and "1" to the other between the two sets of m-bit data;

sixth program code means for detecting each bit of the set of m-bit data of which the toggled flag is not raised so as to recognize bit positions at which each bit has not been changed from one of the values "0" and "1" to the other;

seventh program code means for selecting one of the n sets of m-bit data other than the previously selected sets of m-bit data, the one of the n sets of m-bit data including a set of bits at the recognized bit positions having a maximum Hamming distance from the set of bits at the bit positions recognized by the sixth program code means;

eighth program code means for updating the toggled flag by comparing the set of bits of the one of n sets of m-bit data selected by said seventh program code means with the set of bits at the bit positions recognized by said sixth program code means so that the toggled flag is raised for each bit of which a value is changed from one of the values "0" and "1" to the other;

ninth program code means for repeating the sixth, seventh and eight program code means until a predetermined condition is satisfied; and tenth program code means for rendering the operation cycles corresponding to the previously selected sets of m-bit data to be the IDDQ test cycles.

23. A processor readable medium storing program code means for causing a computer to select IDDQ test cycles by performing a logical simulation of an operation of an integrated circuit including a plurality of internal nets, comprising:

first program code means for performing logical simulation of an operation of said integrated circuit;

second program code means for determining whether an operation cycle in the logical simulation is in a standby state, a determination being performed on an individual operation cycle basis;

third program code means for selecting a first IDDQ test cycle which is determined to be in the standby state first;

fourth program code means for storing a set of m-bit data corresponding to said first IDDQ test cycle as a reference set of m-bit data, the set of m-bit data comprising a number of bits corresponding to the number of internal nets included in said integrated circuit;

fifth program code means for setting a reference value with respect to a Hamming distance in accordance with a set of m-bit data which comprises a number of bits corresponding to the number of internal nets included in said integrated circuit;

sixth program code means for continuing the logical simulation and selecting a second IDDQ test cycle which is determined to be in the standby state, a set of m-bit data corresponding to said second IDDQ test cycle having a Hamming distance greater than said reference value with respect to the set of m-bit data corresponding to said first IDDQ test cycle;

seventh program code means for preparing a toggled flag for each of the m bits of the reference set of m-bit data, the toggled flag indicating whether the corresponding bit of the reference set of m-bit data has been set to both values "0" and "1" at least once;

eighth program code means for storing the set of m-bit data corresponding to said second IDDQ test cycle as the reference set of m-bit data;

ninth program code means for setting the toggled flag by comparing the set of m-bit data corresponding to said first IDDQ test cycle with the set of m-bit data corresponding to said second IDDQ test cycle so that the toggled flag is raised for each bit of which value has been changed from one of the values "0" and "1" to the other between the two sets of m-bit data;

tenth program code means for detecting each bit of the reference set of m-bit data for which the toggled flag is not raised so as to recognize bit positions at which each bit has not been changed from one of the values "0" and "1" to the other;

eleventh program code means for selecting a next IDDQ test cycle which is determined to be in the standby state, a set of m-bit data corresponding to the next IDDQ test cycle at the recognized bit positions having a Hamming distance greater than said reference value with respect to the reference set of m-bit data at the recognized bit positions;

twelfth program code means for updating the toggled flag by comparing the set of m-bit data corresponding to the next IDDQ test cycle with the reference set of m-bit data so that the toggled flag is raised for each bit of which a value has been changed from one of the values "0" and "1" to the other;

thirteenth program code means for storing the set of m-bit data corresponding to the next IDDQ test cycle as the reference set of m-bit data; and fourteenth program code means for repeating the tenth, eleventh, twelfth and thirteenth program code means until a predetermined condition is satisfied.

* * * * *